United States Patent [19]

Hirasawa et al.

[11] 4,212,025
[45] Jul. 8, 1980

[54] VOLTAGE DIVIDING INTEGRATED CIRCUIT DEVICE

[75] Inventors: Masataka Hirasawa, Ayase; Akira Hashimoto; Haruji Yamazaki, both of Yokohama, all of, Japan

[73] Assignee: Tokyo Shibaura Electric Co., Ltd., Japan

[21] Appl. No.: 873,881

[22] Filed: Jan. 31, 1978

[30] Foreign Application Priority Data

Jan. 31, 1977 [JP] Japan .................................. 52-9397

[51] Int. Cl.[2] ............................................. H01L 27/04
[52] U.S. Cl. ........................................ 357/51; 357/42; 357/48; 357/86; 357/89
[58] Field of Search ...................... 357/41, 51, 91, 42, 357/89, 86, 22

[56] References Cited

U.S. PATENT DOCUMENTS

| | | | |
|---|---|---|---|
| 4,034,395 | 7/1977 | Abdelrahman | 357/48 |
| 4,070,653 | 1/1978 | Rao et al. | 357/91 |

OTHER PUBLICATIONS

RCA Cos/Mos I.C. Manual, (RCA, Somerville, N. J., 1971); pp. 25, 146–147.

*Primary Examiner*—William D. Larkins
*Attorney, Agent, or Firm*—Finnegan, Henderson, Farabow, Garrett & Dunner

[57] ABSTRACT

In a first conductivity type semiconductor substrate a plurality of second conductivity type regions are formed. First conductivity type resistivity regions are formed in the second conductivity type regions, respectively. The first conductivity type resistive regions are connected in series between power source terminals, through at least one divided potential taking-out electrode.

3 Claims, 3 Drawing Figures

VOLTAGE DIVIDING INTEGRATED CIRCUIT DEVICE

BACKGROUND OF THE INVENTION

The present invention relates to a voltage dividing integrated circuit device and, more particularly, a voltage dividing integrated circuit device suitable for providing equally divided potentials necessary for dynamically driving a liquid crystal display device.

An AC driving system is desirable for driving a liquid crystal display device due to its chemical characteristic. That is, in order to prolong the life of liquid crystal display device, it is necessary to cancel out the influence of a positive applied voltage on the liquid crystal display device by application of a negative voltage and vice versa. The dynamic driving system in which segment electrodes of the display device are scanned on the basis of a time division, generally uses voltage levels of three or more because the liquid crystal device has a relatively long response time. In the drive voltages, the maximum and the minimum voltage levels may be positive and negative potential levels of a power supply source. The intermediate potential levels may be provided by division of the power source voltage. In electronic digital apparatus, it is desirable that the voltage dividing circuit be integrated on a single semiconductor chip, together with a logic circuit section and a liquid crystal drive circuit.

Referring to FIG. 1, there is shown an example of an integrable voltage dividing circuit which is disclosed in the copending application Ser. No. 818,295, filed Sept. 22, 1977, entitled "DISPLAY DEVICE DRIVING VOLTAGE PROVIDING CIRCUIT" and assigned to the same assignee as the present application.

In this example which is directed to a $\frac{1}{3}$ duty and $\frac{1}{3}$ prebias display system, a voltage dividing circuit 11 connected between power supply terminals 12 and 13 connected across a $-E$ volt power source 14 provides to a driver circuit 15 the minimum potential $-E_O$, the maximum potential 0 volt, and equally divided voltages $-\frac{3}{4}E_O$, $-\frac{1}{2}E_O$, and $-\frac{1}{4}E_O$. The driver circuit 15 is connected to receive control signals $h_1$, $h_2$ and $h_3$ and data signals from a CMOS logic circuitry 17 to provide to an 8-digit liquid crystal display device 16 scanning pulses $H_1$, $H_2$ and $H_3$, segment signals $\alpha_1$ to $\alpha_8$, $\beta_1$ to $\beta_8$ and $\gamma_1$ to $\gamma_8$.

The voltage dividing circuit 11 is comprised of four voltage dividing units $U_1$ to $U_4$ connected in series between the power supply terminals 12 and 13. The voltage dividing unit $U_1$ includes resistive elements $R_{11}$ and $R_{21}$ and a P channel MOS transistor $P_1$; the dividing unit $U_2$ resistive elements $R_{12}$ and $R_{22}$ and a P channel MOS transistor $P_2$; the dividing unit $U_3$ resistive elements $R_{13}$ and $R_{23}$ and an N channel MOS transistor $N_1$; the dividing unit $U_4$ resistive elements $R_{14}$ and $R_{24}$ and an N channel MOS transistor $N_2$. A clock pulse $\phi$ is applied to the gates of the P channel MOS transistors $P_1$ and $P_2$. A clock pulse $\bar{\phi}$ is applied to the gates of the N channel MOS transistors $N_1$ and $N_2$. For obtaining the equally divided potentials, the resistors $R_{11}$ to $R_{14}$ have equal resistance values and similarly resistors $R_{21}$ to $R_{24}$ have equal resistance values. The resistance value of the resistors $R_{11}$ to $R_{14}$ may be ranged from 100 to 400kΩ and the resistance value of the resistors $R_{21}$ to $R_{24}$ may be approximately 10kΩ.

The voltage dividing circuit 11 is formed on a single semiconductor chip, together with the CMOS logic circuit 17 and the driver circuit 15. In the integrated circuit, a resistor is made of a semiconductor region of a conductivity type opposite to that of a semiconductor region in which the resistor is formed. In order that a plurality of resistive regions have the same resistance values, these regions are generally formed to have the same dimensions. For a high density integrated circuit it is desirable to make the occupied areas of the high resistance elements $R_{11}$ to $R_{14}$ as small as possible. This necessitates, however, increase of sheet resistance of the resistive region. For this reason, the resistive region is formed by a semiconductor region having a low concentration of impurities. In this case, the voltage-current characteristic of the resistor region with a low concentration of impurities depends largely on a potential difference between the resistor region and the substrate, compared to a resistive region with a high concentration of impurities. In general, the resistive region with a low concentration of impurities has a saturation characteristic in which current flowing through the resistor region does not change linearly with change of an applied voltage but saturates. The degree of the current saturation becomes larger as the potential difference between the resistive region and the substrate is larger. Therefore, with respect to the resistors $R_{11}$ to $R_{14}$ shown in FIG. 1, the potential difference becomes larger in the order of $R_{11}$, $R_{12}$, $R_{13}$ and $R_{14}$. As a result, where the resistive regions $R_{11}$ to $R_{14}$ have the same dimensions, even if the same voltage is applied across each resistive region, the resistive regions $R_{11}$ to $R_{14}$ would have different resistance values. This implies that it fails to obtain desired equally divided potentials for driving liquid crystal and the life of the liquid crystal is shortened.

SUMMARY OF THE INVENTION

Accordingly, an object of the present invention is to provide a voltage dividing integrated circuit device for providing equally divided potentials.

Another object of the present invention is to provide a voltage dividing integrated circuit device which produces equally divided potentials for driving a liquid crystal display device.

Still another object of the present invention is to provide a voltage dividing integrated circuit device which can be preferably integrated on a semiconductor chip together with a CMOS logic circuitry.

According to the present invention, there is provided a voltage dividing integrated circuit device for providing equally divided potentials between first and second potentials comprising: a semiconductor substrate of a first conductivity type coupled with a predetermined potential; a plurality of semiconductor regions of a second conductivity type separately formed in the semiconductor substrate; and a plurality of resistive regions of the first conductivity type formed in the second conductivity type regions, respectively, the first conductivity type resistive regions being connected in series between first and second potential supply terminals, through at least one equally divided potential taking-out electrode.

These and other objects of the invention will be seen by reference to the description, taken in connection with the accompanying drawings, in which:

DETAILED DESCRIPTION OF THE PREFERRED EMBODIMENT

Figure 1:
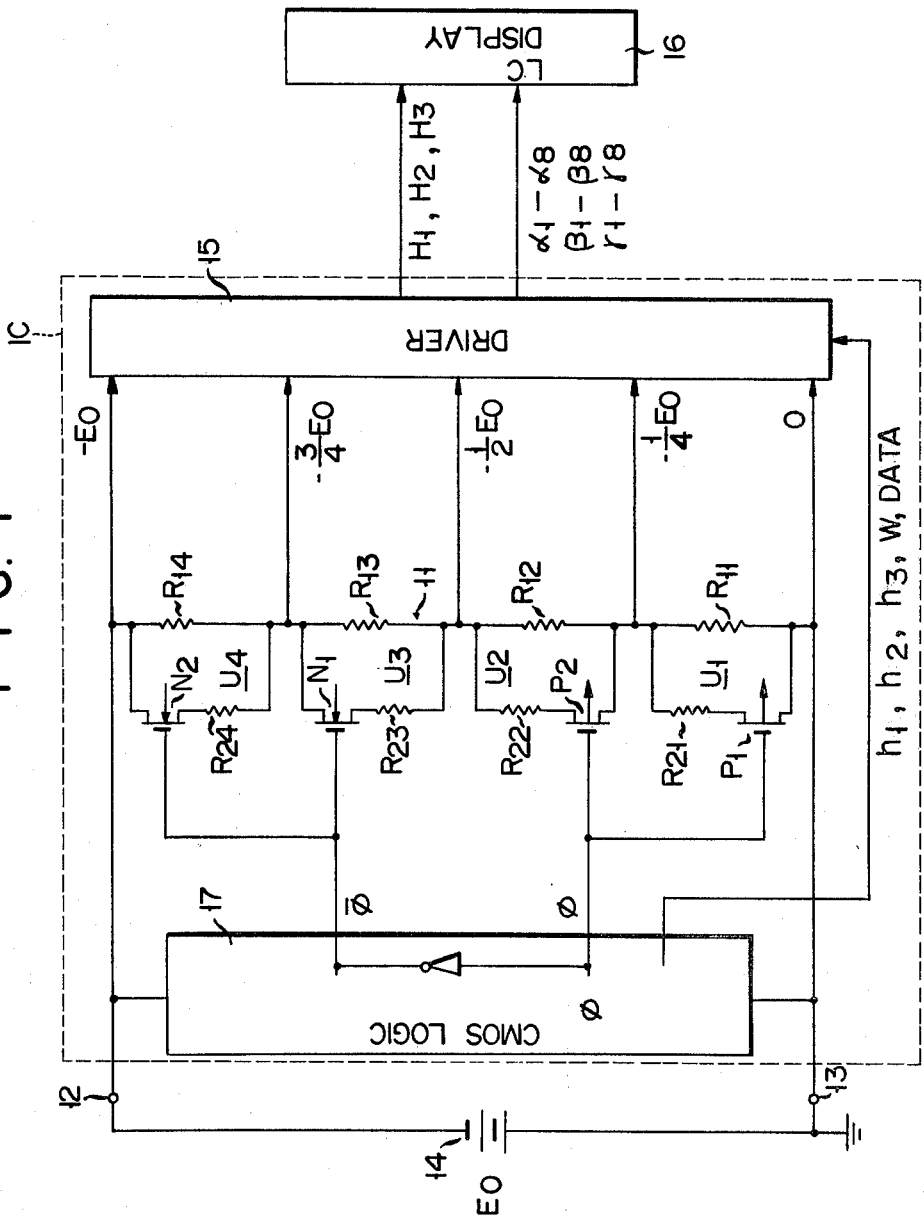
FIG. 1 shows an example of a circuit diagram of a driving voltage source for a liquid crystal display device.
Figure 2:
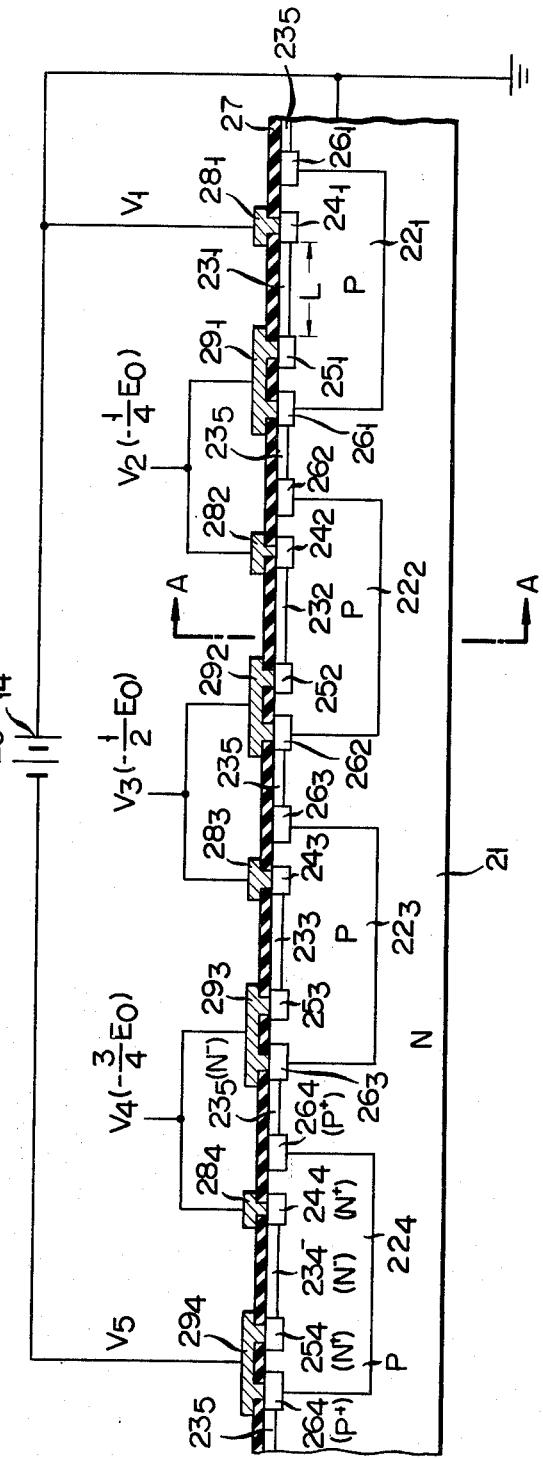
FIG. 2 schematically shows in cross section an example of a voltage dividing integrated circuit device according to the present invention.

In FIG. 2 illustrating an embodiment of a voltage dividing integrated circuit device according to the present invention, reference numeral 21 designates an N type semiconductor substrate of which the impurity concentration is approximately $10^{15}/cm^3$. A plurality of P type regions, or P wells $22_1$ to $22_4$ with low impurity concentration are formed in the substrate 21 adjacent to the major surface thereof, as shown. The P wells $22_1$ to $22_4$ are formed concurrently with other P wells in which N channel MOS transistors in the logic circuitry are to be formed. $N^-$ type resistive regions $23_1$ to $23_4$ with an impurity concentration of about $10^{17}/cm^3$ are formed in the P wells $22_1$ to $22_4$, respectively, by using an ion implantation technique. These resistive regions correspond to the resistors $R_{11}$ to $R_{14}$ in FIG. 1, respectively. The depth of each resistive region is about 5,000 Å to 1µ. Further, these resistive regions are each disposed between a couple of $N^+$ diffusion layers $24_1$ and $25_1$, $24_2$ and $25_2$, $24_3$ and $25_3$, and $24_4$ and $25_4$, as shown. The lengths L and widths of the resistive regions are equal. $P^+$ diffusion layers $26_1$ to $26_4$ are formed along the PN junctions of the P wells $22_1$ to $22_4$ and the semiconductor substrate 21. The $N^+$ layer $24_1$ in the P well $22_1$ is connected to an aluminum electrode layer $28_1$ through a through-hole of a dioxide layer 27 deposited on the substrate 21. The $P^+$ layer $26_1$ in the same well and the $N^+$ layer $25_1$ are connected to an aluminum electrode $29_1$ through through-holes of the layer 27. Similarly, the $N^+$ layer $24_2$ of the P well $22_2$ is connected to an aluminum electrode layer $28_2$ and the $N^+$ region $25_2$ and $P^+$ region $26_2$ are both connected to an aluminum electrode $29_2$. The $N^+$ region $24_3$ of the P well $22_3$ is connected to an aluminum electrode $28_3$ and the $N^+$ region $25_3$ and $P^+$ region $26_3$ are both connected to an aluminum electrode layer $29_3$. The $N^+$ region $24_4$ of the P well $22_4$ is connected to an aluminum electrode $28_4$ and the $N^+$ region $25_4$ and $P^+$ region $26_4$ are both connected to an aluminum electrode $29_4$. The electrode layer $29_4$ is connected to a negative terminal of a power source 14. The electrode layer $28_1$ and the semiconductor substrate 21 are connected to a positive terminal of the power source 14, i.e. circuit ground. The electrodes $29_1$ and $28_2$, $29_2$ and $28_3$, and $29_3$ and $28_4$ are each pair connected to each other so that the resistive regions $23_1$, $23_2$, $23_3$ and $23_4$ are connected in series between the positive and negative terminals of the power source 14. The interconnected electrodes $29_1$ and $28_2$ are adapted to take out a divided potential $V_2(-\frac{1}{4}E_O)$; the interconnected electrodes $29_2$ and $28_3$ take out a divided potential $V_3(-\frac{1}{2}E_O)$; the interconnected electrodes $29_3$ and $28_4$ take out a divided potential $V_4(-\frac{3}{4}E_O)$. On the surface of the semiconductor substrate 21 except for the P wells $22_1$ to $22_4$ and the $P^+$ regions $26_1$ to $26_4$ are formed shallow $N^-$ type regions $23_5$ concurrently with the $N^-$ type resistive regions $23_1$ to $23_4$ by ion implantation process.

The $N^+$ layers $24_1$ to $24_4$ and $25_1$ to $25_4$ are used to make ohmic-contact of the respective resistive regions with the corresponding electrodes. The $P^+$ regions make ohmic-contact of the P wells $22_1$ to $22_4$ with the electrodes $29_1$ to $29_4$, respectively. The $P^+$ regions $26_1$ to $26_4$ may be formed in the corresponding P wells $22_1$ to $22_4$, respectively.

In the integrated circuit device as mentioned above, the potential differences between the respective resistive regions and the semiconductor substrate are different; however, the potential differences between the respective resistive regions and the corresponding P wells are equal because the P wells are connected to one end of the corresponding resistive regions, respectively. Accordingly, if the respective resistive regions are formed with the same dimensions, the respective resistive regions have the same saturation characteristics so that the potential differences across the respective resistive regions are substantially equal. Therefore, the divided potentials $V_2$, $V_3$ and $V_4$ taken out are substantially equal to potentials $-\frac{1}{4}E_O$, $-\frac{1}{2}E_O$ and $-\frac{3}{4}E_O$. That is, the saturation characteristic of each resistive region depends on the voltage thereacross and not on the potential difference between the resistive region and the substrate.

Figure 3:
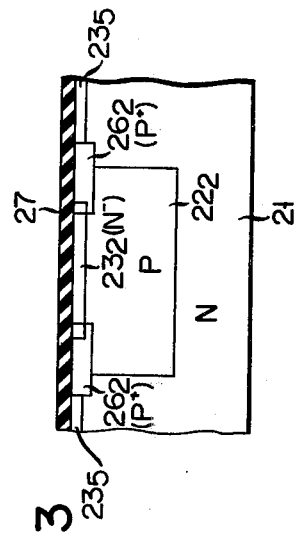
FIG. 3 shows a cross section taken along a line A—A of FIG. 2.

FIG. 3 shows a cross sectional view taken along a line A—A of FIG. 2. As seen from the figure, both ends of the resistive region overlap with the $P^+$ region. With such structure a potential difference occurs between the resistive region and the $P^+$ region. This narrows the current flowing width in the resistive region to facilitate current saturation tendency. As a consequence, the sheet resistance of the resistive region is increased so that the same resistance may be obtained even with the shorter length of the resistive region.

The above mentioned $N^-$ type semiconductor regions $23_5$ have an impurity concentration higher than that of the semiconductor substrate 21 and are adapted to stabilize the surface of the N type substrate 21 and to enhance isolation between the independent P wells $22_1$ to $22_4$. Similar N type semiconductor regions may be formed on the surface of the substrate 21 concurrently with the $N^-$ type semiconductor regions $23_5$ for enhancing isolation between respective elements such as P channel MOS transistors and P wells in which N channel MOS transistors are to be formed therein, thereby providing a highly reliable integrated circuit structure.

The embodiment of the present invention has been described with reference to a liquid crystal drive voltage generating circuit with five voltage levels. However, the present invention is applicable for four or three level drive voltage generating circuit. The semiconductor substrate used in the above mentioned embodiment was of N type but may be of P type. In the latter case, the respective regions in FIG. 2 are opposite in conductivity to those of FIG. 2 and the polarity of the power source also is opposite to that of FIG. 2. For reduction of current consumption, MOS transistors which are periodically turned on and off may be connected in series with the respective resistive regions. Additionally, means for connecting the $P^+$ regions $26_1$ to $26_4$ to $N^+$ regions $25_1$ to $25_4$, respectively may be omitted. In this case, the potential difference between the resistive regions and the substrate is absorbed by the reverse biased PN junction between the P well and the substrate, and each P well is auto-biased to a potential at the N+ region by a forward biased PN junction defined by the respective P wells $22_1$ to $22_4$ and the respective N+ regions $25_1$ to $25_4$.

What we claim is:

1. An integrated circuit voltage divider comprising:
   a semiconductor substrate of a first conductivity type;
   a plurality of first regions having a second conductivity type and separately formed in said substrate, each forming a PN junction with said substrate;
   a plurality of second regions having said second conductivity type, each of said second regions formed in said substrate along said PN junctions formed by said substrate and a corresponding one of said first regions, and each of said second regions having an impurity concentration higher than the impurity concentration of said first regions;
   a plurality of identical resistive regions having said first conductivity type, each of said resistive regions formed in a corresponding one of said first regions, and each of said resistive regions having first and second sides and first and second ends, said first and second sides of each resistive region being in contact with a corresponding one of said second regions; and
   connection means for electrically connecting said resistive regions in series with one another, first ends connected to second ends, across a source of supply voltage to be divided, and for providing a precision voltage drop of said source voltage at said connected first and second ends of said resistive regions, said connection means including means for electrically connecting each first end of each of said resistive regions with said corresponding one of said second regions to prevent PN junctions formed by said resistive regions and said first regions from being forward-biased.

2. The voltage divider according to claim 1, further comprising means for isolating said first regions from one another.

3. The voltage divider according to claim 1 wherein said connection means includes ohmic region means of said first conductivity type for making ohmic-contact with said first and second ends of each of said resistive regions.

* * * * *